United States Patent
Fujimaki

(10) Patent No.: US 7,132,729 B2
(45) Date of Patent: Nov. 7, 2006

(54) SEMICONDUCTOR DEVICE AND METHOD OF MANUFACTURING SAME

(75) Inventor: Hirokazu Fujimaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 150 days.

(21) Appl. No.: 10/929,475

(22) Filed: Aug. 31, 2004

(65) Prior Publication Data

US 2005/0199980 A1    Sep. 15, 2005

(30) Foreign Application Priority Data

Mar. 9, 2004    (JP) .............................. 2004/065598

(51) Int. Cl.
    *H01L 27/082*    (2006.01)
(52) U.S. Cl. ...................... 257/577; 438/328; 438/425; 438/431; 257/499; 257/506
(58) Field of Classification Search ................. 438/328; 257/577
    See application file for complete search history.

(56) References Cited

U.S. PATENT DOCUMENTS 5,474,953 A * 12/1995 Shimizu et al. ............. 438/426

6,410,958 B1    6/2002 Usui et al.
6,417,555 B1    7/2002 Ueno et al.

FOREIGN PATENT DOCUMENTS

| JP | 06-318600 | 11/1994 |
|---|---|---|
| JP | 09-172061 | 6/1997 |
| JP | 10-135454 | 5/1998 |
| JP | 2000-031264 | 1/2000 |
| JP | 2002-164540 | 6/2002 |

* cited by examiner

*Primary Examiner*—Carl Whitehead, Jr.
*Assistant Examiner*—Colleen E. Rodgers
(74) *Attorney, Agent, or Firm*—Rabin & Berdo, P.C.

(57) ABSTRACT

The present invention provides a semiconductor device formed with a diode array together with bipolar transistors, which is capable of preventing the occurrence of crystal defects developed in cross patterns in deep trench regions and improving device yields, and a method of manufacturing the semiconductor device. A semiconductor device includes a LOCOS oxide film which isolates a plurality of diodes in an X direction, and deep trenches which isolate the plurality of diodes in a Y direction. The depth of each of the deep trenches is deeper than a high density layer embedded below a collector layer of each bipolar transistor. A shallow trench may be used as an alternative to the LOCOS oxide film.

3 Claims, 5 Drawing Sheets

SEMICONDUCTOR DEVICE AND METHOD OF MANUFACTURING SAME

BACKGROUND OF THE INVENTION

1. Field of the Invention

The present invention relates to a semiconductor device, and particularly to a semiconductor device having high adaptability to a high speed bipolar process and formed with a highly integrated transistor array or a diode array, and a method of manufacturing the semiconductor device.

2. Description of the Related Art

Even of LSIs, a high speed bipolar device has high speed performance and high current drive capacity as compared with a CMOS device. Therefore, the high speed bipolar device has the edge over an application-specific device. There are known, for example, a laser-driven LSI for optical transmission, a power amplifier for a cellular phone, etc. Also the high speed bipolar device has a high potential in realizing a high-accuracy and a high-sensitive LSI even other than these applications. It can be said that these are similar not only to analog devices but also to digital devices.

Such a bipolar device has a merit toward actualization of various leading-edge devices. Of these, some kind of memory-system device or light-detecting device is capable of bringing out performance unattainable to CMOS by realizing bipolar devices and a highly integrated transistor array or a diode array within the same chip.

A prior art example that realizes such a demand will be explained below. The current typical high-speed bipolar transistor generally adopts an isolation method utilizing LOCOS or a shallow trench and deep trenches in combination. Each of the deep trenches is buried with a CVD oxide film with a view toward minimizing substrate-to-collector capacity.

A schematic sectional structure of a high speed bipolar transistor is shown in FIG. 6(a). A schematic sectional structure of a diode array formed over a semiconductor substrate identical to the bipolar transistor is shown in FIG. 6(b). Further, a schematic plan view at the time that diodes 660 are arranged within the plane in grid form and brought into integration, is shown in FIG. 6(c).

Here, an $N^+$ type buried layer 620 containing As in a high density is formed in a P type silicon substrate 610. An N type epitaxial layer 621 that serves as a collector layer is formed on the $N^+$ type buried layer 620. Deep trenches 630 each buried thereinside with a CVD oxide film are formed in a device isolation region. After etching of the deep trenches 630, boron is ion-implanted to form channel stop layers 635 for enhancing a further isolation effect.

A LOCOS oxide film 640 of about 0.7 m is formed around the N type epitaxial layer 621 to reduce parasitic capacity. Further, according to a self-aligned process, a P type base layer 622 and an N type emitter layer 623 are formed over the N type epitaxial layer 621 from one mask. Thereafter, a collector electrode 651, an emitter electrode 650 and base electrodes 652 that connect the collector layer, emitter layer and base layer respectively are formed on an insulating film 625. A detailed structure of a junction portion will not be explained.

The diode shown in FIG. 6(b) can be formed in a process similar to the self-aligned bipolar transistor shown in FIG. 6(a). Thus, a PN junction diode is configured in which the emitter electrode 650 of the transistor is provided as a cathode 654 and the base electrode 652 is provided as an anode 653. Here, no LOCOS oxide film is formed inside the diode array, and the LOCOS oxide film 641 is formed only outside the diode array. This is because a pattern conversion difference caused by the formation of the LOCOS oxide film is reduced to form a more highly integrated array.

A self-aligned contact method for reducing a parasitic capacitor of a device has been described in a patent document (Japanese Unexamined Patent Publication No. Hei 6(1994)-318600). In order to relax stress in a device isolation trench region, a method of oxidizing a polysilicon film formed within a trench to thereby embed it in the trench has been described in a patent document (Japanese Unexamined Patent Publication No. Hei 9(1997)-172061). A method of forming a polysilicon film before the formation of a CVD silicon film has been described in a patent document (Japanese Unexamined Patent Publication No. 2000-31264). A high withstand and low on-resistance device in which the depth and open width of a trench and the width of a current path region have been defined, has been described in a patent document (Japanese Unexamined Patent Publication No. 2002-164540). Further, a method of preventing the occurrence of a crack without forming a bonding pad over each cross trench has been described in a patent document (Japanese Unexamined Patent Publication No. Hei 10(1998)-135454).

However, in the general method of forming the deep trenches in the device isolation region and burying the deep trenches with the CVD oxide film in the transistors or diode array, a crossed pattern portion C of the deep trenches 630 occurs as shown in FIG. 6(c) and the probability of occurrence of a crystal defect becomes high at the crossed pattern portion of the trenches as distinct from other portions, with the result that yields are reduced. The induced cause of the crystal defect results from going out of stress balance of a trench end with thermal shrinkage in a heat-treating process subsequent to the formation of the CVD oxide film.

SUMMARY OF THE INVENTION

Therefore, the present invention has been made in view of such a problem. An object of the present invention is to provide a semiconductor device which is capable of preventing the occurrence of crystal defects in cross patterns in deep trench regions and enhancing device yields in transistors and a diode array, and a method of manufacturing the semiconductor device.

According to one aspect of the present invention, for achieving the above object, there is provided a semiconductor device formed with a diode array together with bipolar transistors, wherein diodes are isolated in one direction by a LOCOS oxide film and isolated in the other direction (the direction substantially normal to the one direction) by trenches. The depth of each of the trenches is a trench (deep trench) deeper than a high density layer embedded below a collector layer of the bipolar transistor.

Trenches (shallow trenches) each deeper than the collector layer and shallower than the high density layer can also be used as an alternative to the LOCOS oxide film. Since the pitch between the diodes can be narrowed where the shallow trenches are used, high integration is enabled as compared with the case in which the LOCOS oxide film is used.

Since the deep trenches are formed in grid form for the purpose of device-to-device isolation in the conventional diode array, the stress occurs in each cross pattern portion and the probability of occurrence of the crystal defects becomes high, thus resulting in a reduction in wafer's yield. In the present invention, however, the LOCOS oxide film or shallow trenches are used for the device-to-device isolation in one direction, and the deep trenches are formed only in the direction normal to the one direction. Therefore, the cross patterns of deep trenches are not formed. Since the LOCOS oxide film and the oxide film embedded in each shallow trench are thin, it is possible to suppress the occurrence of stress and reduce the occurrence of crystal defects.

Deep trenches which connect between the deep trenches in T form are further added to the above configuration too. Owing to the patterns connected in T form, the oxide film embedded in each connecting portion becomes thinner than the cross pattern, whereby stress balance can be held at less than or equal to an allowable value for the occurrence of dislocation and the occurrence of crystal defects is reduced.

The deep trenches connecting between the deep trenches in T form are formed every two diodes, and an electrode electrically connected to the high density layer is formed between the two diodes, whereby the potential of the electrode can also be brought or fetched out as a common potential.

Since the configuration of the electrode and the diode can also be operated as a transistor wherein the electrode is set as the collector and the anode and cathode of the diode are respectively set as the base and emitter, the formation of a transistor array is also enabled.

According to another aspect of the present invention, for achieving the above object, there is provided a method of manufacturing a semiconductor device, comprising the following steps of sequentially forming a first oxide film, a nitride film and a second oxide film over a semiconductor substrate and thereafter forming resist patterns opened in slit form on the second oxide film by photolithography; anisotropically etching the second oxide film, the nitride film and the first oxide film with each of the resist patterns as a mask to thereby remove the resist patterns; defining trenches in the semiconductor substrate with the second oxide film as a mask; forming a first thermal oxide film over the surface of each of the trenches; forming a polycrystal silicon film over the second oxide film and the first thermal oxide film of the trench; heat-treating the polycrystal silicon film to form a second thermal oxide film; forming a CVD oxide film so as to bury a gap defined in the second thermal oxide film of each trench; exposing the nitride film by an etchback method; and removing the nitride film.

Thus, since the method of forming the thin thermal oxide film inside each deep trench, forming the thermal oxide film on the formed thermal oxide film by thermal oxidation of thin film polysilicon and burying the remaining gap with the CVD oxide film is used, stress with shrinkage of the CVD oxide film almost disappears. The present method is capable of more effectively reducing crystal defects by combination with the semiconductor device based on the above viewpoint.

Further, heat treatment is done after the step of removing the nitride film with an etchant, thereby removing moisture from the oxide films provided within the trenches. It is, therefore, possible to reduce stress developed in each trench in a subsequent heat-treating process and suppress even the occurrence of crystal defects.

As the CVD oxide film, a low-pressure TEOS (TetraEthylOrthoSilicate) oxide film may preferably be used to bury the gap of the second thermal oxide film.

According to the present invention as described above, cross patterns of deep trenches are not formed using a LOCOS oxide film and shallow trenches. Therefore, thermal shrinkage of an oxide film embedded in each isolation region is lessened to reduce stress at a trench end and prevent the occurrence of crystal defects, thereby making it possible to enhance device's yields.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 shows a semiconductor device according to a first embodiment of the present invention, wherein

FIG. 4 is a process cross-sectional view showing a method of embedding deep trenches, according to a fourth embodiment of the present invention, wherein

FIG. 5 is a process cross-sectional view showing the method of embedding the deep trenches, according to the fourth embodiment, wherein FIG. 6 shows a conventional bipolar transistor and diode array, wherein

DETAILED DESCRIPTION OF THE INVENTION

Figure 1A:
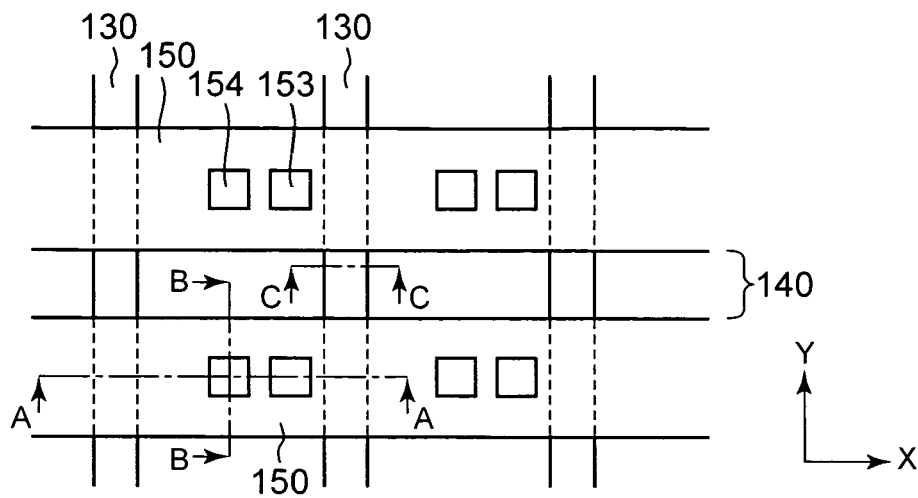
FIG. 1(a) is a planar explanatory view.
Figure 1B:
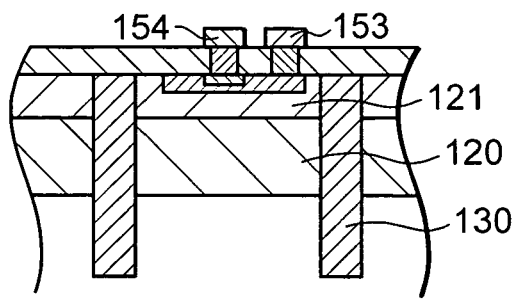
FIG. 1(b) is a cross-sectional view of a portion taken along line A—A in FIG. 1(a)
Figure 1C:
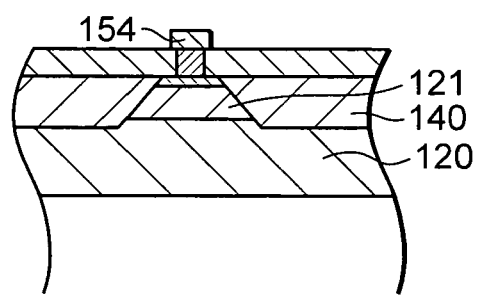
FIG. 1(c) is a cross-sectional view of a portion taken along line B—B in FIG. 1(a)
Figure 1D:
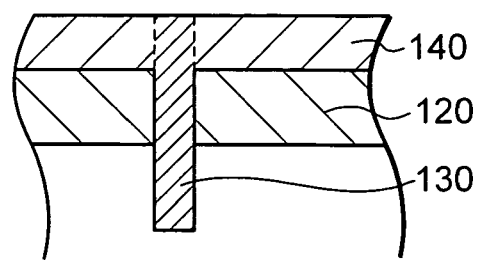
FIG. 1(d) is a cross-sectional view of a portion taken along line C—C in FIG. 1(a)

Preferred embodiments of the present invention will hereinafter be described in detail with reference to the accompanying drawings. Incidentally, elements of structure each having substantially the same functional constitution are respectively identified by the same reference numerals in the present specification and the drawings, and the description of certain common elements of structure will be omitted.

<First Embodiment>

A first embodiment is shown in FIG. 1. FIG. 1(a) is a view for describing the present embodiment on a planar basis. The present embodiment shows a diode array wherein PN diodes 150 each formed with a cathode 154 and an anode 153 are diode-isolated adjacent to one another by deep trenches 130 as viewed in one direction (X direction) and device-isolated using at least one LOCOS oxide film 140 as viewed in the direction (Y direction) normal to the one direction. FIG. 1(b) is a cross-sectional view showing a cross-section of the diode of FIG. 1(a), which is taken along line A—A in FIG. 1(a), FIG. 1(c) is a cross-sectional view illustrating a cross-section taken along line B—B in FIG. 1(a), and FIG. 1(d) is a cross-sectional view showing a cross-section taken along line C—C in FIG. 1(a), respectively.

Figure 5A:
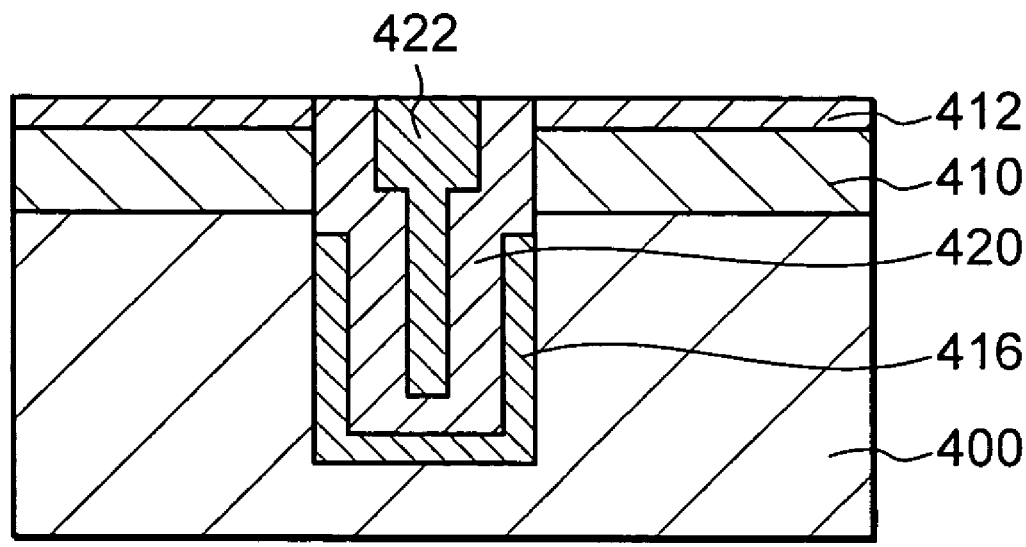
FIG. 5(a) is a view subsequent to embedding of a TEOS film into gaps in the deep trenches and effecting of full-face etchback thereon.
Figure 5B:
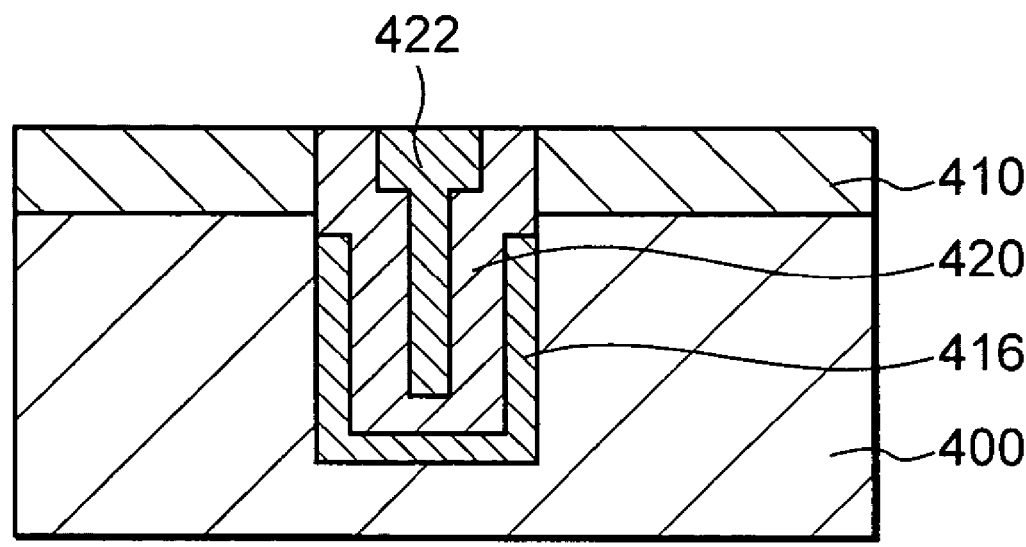
FIG. 5(b) is a view subsequent to removal of a CVD nitride film.

Here, a sectional structure of the PN diode 150 is similar to FIG. 5(b). A spot equivalent to an emitter electrode of an NPN transistor is formed as a cathode 154, and a spot equivalent to a base electrode thereof is formed as an anode 153. An $N^+$ type buried layer 120 corresponding to a high density layer is embedded below an N type epitaxial layer 121 corresponding to an N type collector layer.

A P type layer (emitter layer in the case of the transistor) is formed over the N type epitaxial layer 121. Thereafter, the N type cathode 154 and the P type anode 153 are formed on an insulating film. Since a detailed structure of a junction portion is not important in the present invention, its description will be omitted. The thickness of the LOCOS oxide film 140 is set to about 0.7 μm, the width of each deep trench 130 is set to about 0.5 μm, and the depth thereof is set to about 3.5 μm, respectively.

Since the LOCOS oxide film is formed shallowly, it separates the N type epitaxial layer 121 but does not separate the $N^+$ type buried layer 120 located below the N type epitaxial layer 121. Therefore, the configuration of the present embodiment cannot be applied to such a transistor array that current flows through a buried area placed below each channel layer. Since current paths are formed in a shallow area on the surface of a substrate in the case of the diode array, the configuration of the present embodiment can be applied to the diode array.

Figure 6A:
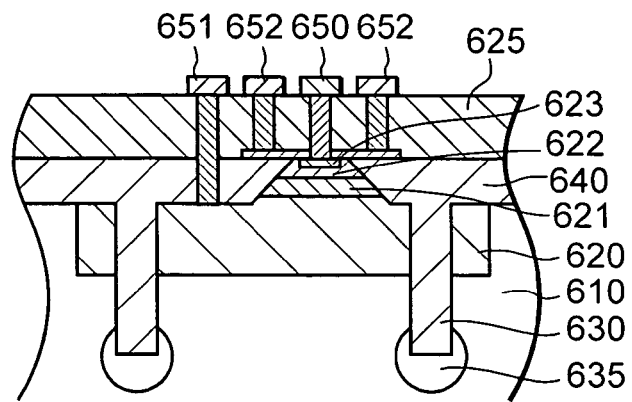
FIG. 6(a) is a schematic cross-sectional view showing the bipolar transistor.
Figure 6B:
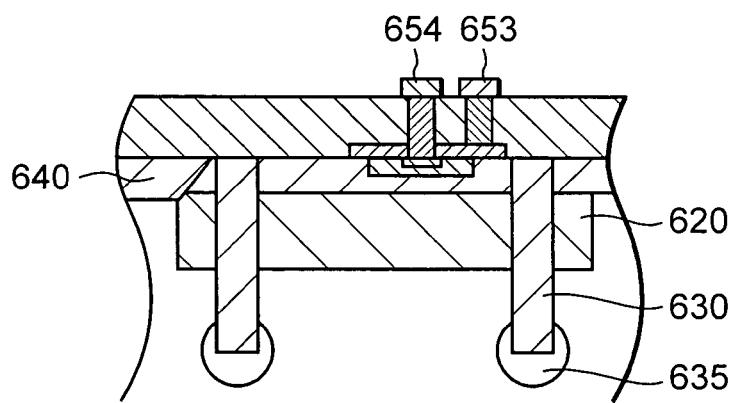
FIG. 6(b) is a schematic cross-sectional view showing a diode.
Figure 6C:
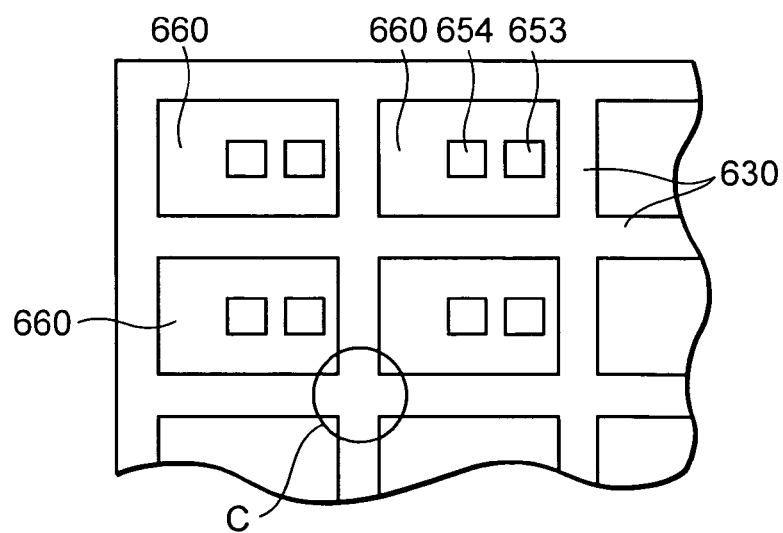
FIG. 6(c) is an explanatory view showing the diode array on a planar basis.

Thus, since the deep trenches are not formed in lattice or grid form, such cross patterns as shown in FIG. 6(c) are not produced as shown in the explanatory view of FIG. 1(a). Further, when the high density layer ($N^+$ type buried layer 120) placed below the channel layer is formed over the whole surface of the diode array, the buried layer can provide a potential common to the diodes arranged in respective rows as viewed in the Y direction. However, the buried areas are perfectly isolated in the adjacent diodes extending in the X direction, which are isolated by the deep trenches.

Thus, the respective diodes are separated from one another without generating the cross patterns of the deep trenches. When the cross patterns exist, stress increases due to a thickened CVD oxide film so that crystal defects occur. However, if the cross patterns of the deep trenches are not formed, then a stress balance to an active region of each diode is improved so that the probability of occurrence of dislocation can be greatly suppressed.

As described above, the yields of the highly-integrated diode array can be greatly improved. Further, since the high density buried layer is supplied with the common potential, the effect of suppressing a parasitic effect is also obtained. Further, although the present embodiment has explained that it is not possible to carry out the application thereof to the transistor array, the present embodiment can be used as a special-purpose transistor array wherein the high density buried layer is set as a common collector of a one-way array.

<Second Embodiment>

Figure 2:
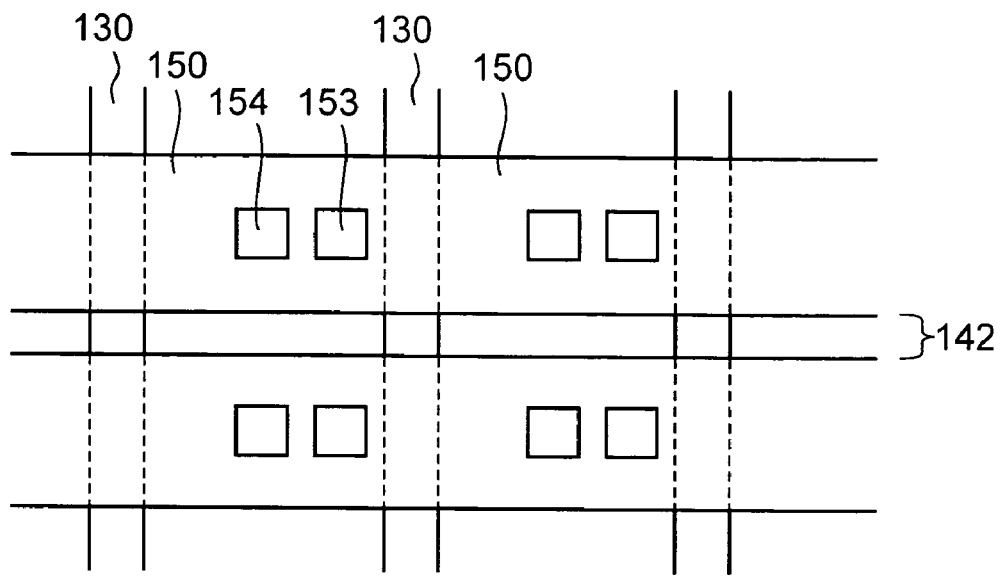
FIG. 2 is a planar explanatory view illustrating a semiconductor device according to a second embodiment of the present invention.

A second embodiment is shown in FIG. 2. The present embodiment is one wherein device isolation is carried out by at least one shallow trench 142 as an alternative to the device isolation by the LOCOS oxide film employed in the first embodiment. The present embodiment is similar to the first embodiment in other configuration. That is, the present embodiment shows a diode array in which devices are isolated in one direction (X direction) by the deep trenches 130 and isolated in the direction (Y direction) normal to the one direction by the shallow trench 142.

The depth of the shallow trench is about 0.5 m and an HDP (High Density Plasma) film of an $SiO_2$ system is embedded into the shallow trench. Since, however, the shallow trench is planarized using CMP (Chemical Mechanical Polishing) and formed by the known technology, the detailed description of a method of forming the shallow trench is omitted.

Since the devices are isolated by using the shallow trench as an alternative to the LOCOS oxide film in the present embodiment, the diode pitch in the Y direction can be shortened. Although the LOCOS isolation employed in the first embodiment needs a 2.5 μm pitch, for example, where a design rule of 0.25 μm is used, a pitch equivalent to almost 2.0 μm can be realized where the shallow trench is used.

On the other hand, since the HDP film is a CVD film as distinct from the thermal oxide film employed in the LOCOS method, a slight shrinkage occurs due to heat treatment in a subsequent process and stress ascribable to the shrinkage takes place. Since it leads to the occurrence of dislocation, the optimization of heat treatment with respect to the whole process is required.

However, a low pressure TEOS (tetraethoxy silane) film relatively large in water content, which is suitable for embedding a film into each deep trench, is used in the case of the deep trenches, whereas the HDP film suitable for embedding the shallow trench is sufficiently low in water content and the level of stress due to the shrinkage is greatly improved as compared with stress developed in the crossed pattern portion of the conventional deep trenches.

<Third Embodiment>

Figure 3:
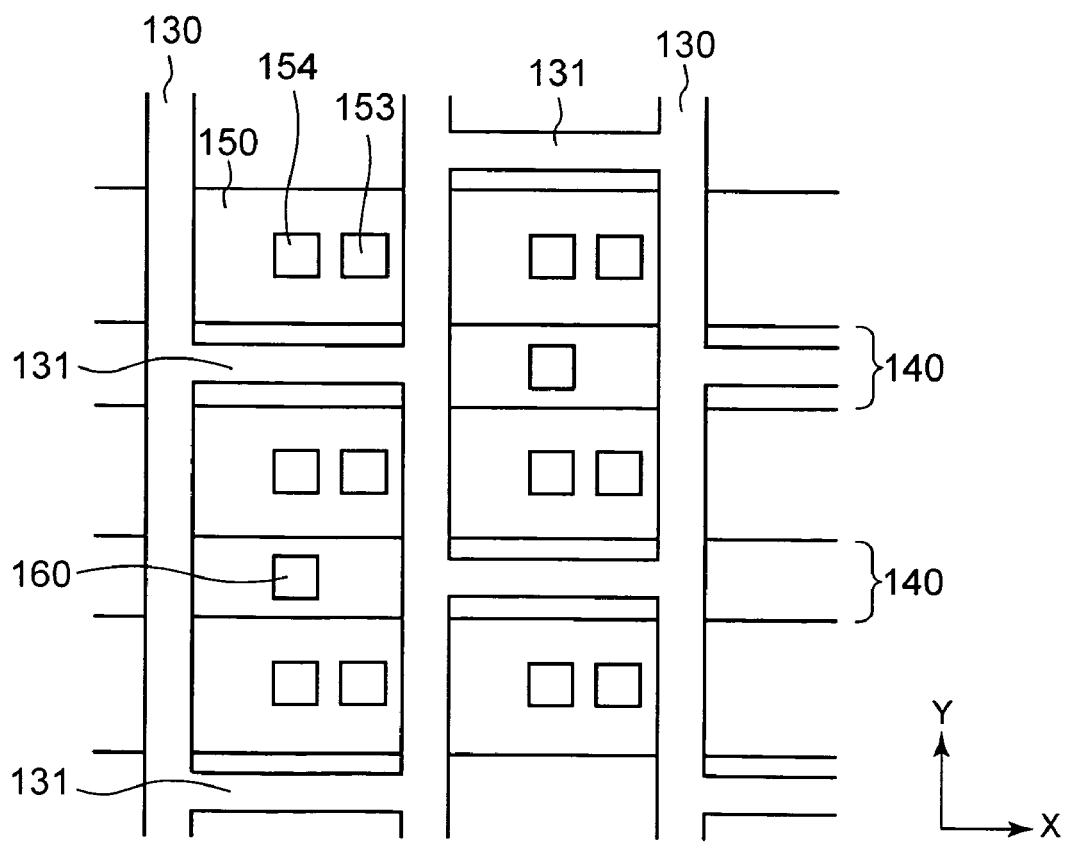
FIG. 3 is a planar explanatory view showing a semiconductor device according to a third embodiment of the present invention.

A third embodiment is shown in FIG. 3. The present embodiment is one wherein deep trenches for coupling between the deep trenches employed in the first embodiment are formed. Although the deep trenches are formed in grid form, no cross patterns are formed as in the prior art and the coupled portions of the deep trenches become T-type patterns. At this time, the isolation by the shallow trench employed in the second embodiment may be adopted as an alternative to the isolation by the LOCOS oxide film employed in the first embodiment.

That is, the present embodiment shows a diode array wherein devices are isolated in one direction (X direction) by deep trenches 130 and isolated in the direction (Y direction) normal to the one direction by using LOCOS oxide films 140 or shallow trenches, and deep trenches 131 are formed in the X direction so as to connect between the deep trenches 130 every plural diodes, for example, every two diodes in FIG. 3.

As shown in FIG. 3, for example, the deep trenches 131 can be arranged on both sides of the two diodes adjacent to each other as viewed in the Y direction, and collector plugs 160 can be formed as electrodes at intermediate portions of the LOCOS oxide films 140. Thus, the collector plug 160 can be set to a potential common to the two diodes.

Since transistors can be formed if cathodes 154, anodes 153 and the collector plugs 160 are configured as emitter electrodes, base electrodes and collector electrodes respectively, a transistor array can also be formed.

Since the deep trenches are formed so as to take the T-type patterns other than the conventional cross patterns upon formation of the deep trenches in grid form in the present embodiment, a change in the thickness of each locally embedded oxide film can be suppressed, no large stress occurs and the occurrence of crystal defects can also be suppressed.

Further, the present structure is different from the prior art in that the T-type coupled-portions of the deep trenches are placed inside a LOCOS oxide film region or a shallow trench region. An oxide film layer of the deep trenches and the LOCOS oxide film (or shallow trench) are capable of effectively relaxing thermal stress developed in emitter and base junctions that serve as active regions. Further, since the portion at which each deep trench is brought into contact with a substrate, corresponds to a bottom portion of the LOCOS oxide film (or shallow trench), which is placed in a position deeper than the active junction region at which each diode is formed, the occurrence of dislocation can be suppressed and the influence of dislocation can be lessened even where the dislocation has occurred.

As an application, there is a demand for the use of diodes with two as a pair as basic units and a desire to supply a fixed potential even to a buried layer. In such a case, the two diodes adjacent to each other in the Y direction are used as one pair and the deep trenches are formed on both sides thereof, thereby enabling their perfect isolation. Further, the whole buried layer can be set to a fixed potential by forming each of the collector plugs in the LOCOS oxide film (or shallow trench) that lies midway between the two diodes.

<Fourth Embodiment>

A method of embedding deep trenches, according to a fourth embodiment will be explained using process cross-sectional views shown in FIG. 4. A LOCOS oxide film (thermal oxide film) 410 corresponding to a first oxide film is laminated on a silicon substrate 400 with a thickness of 0.7 μm, a nitride film 412 is laminated on the LOCOS oxide film 410 with a thickness of 0.1 μm by a CVD method, and a CVD oxide film 414 corresponding to a second oxide film is laminated on the nitride film 412 with a thickness of 0.5 μm, sequentially respectively. Next, resist patterns for the deep trenches are formed by the known exposure technology.

Figure 4A:
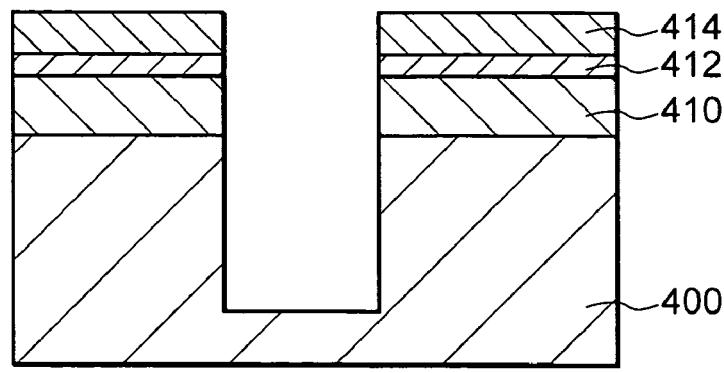
FIG. 4(a) is a view subsequent to the formation of the deep trenches.

Further, the CVD oxide film 414, the nitride film 412 and the LOCOS oxide film 410 are sequentially removed substantially at rights by anisotropic etching with the resist patterns as masks. Thereafter, the resists are removed and thereafter the silicon substrate 400 is etched at a depth of about 3.5 μm with the CVD oxide film 414 as a mask to form a deep trench having a width of about 0.5 μm. The so-formed one is shown in FIG. 4(a).

Figure 4B:
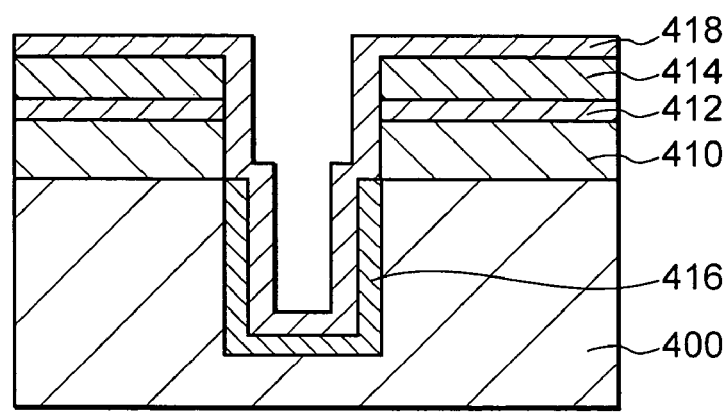
FIG. 4(b) is a view subsequent to the formation of polysilicon into the deep trenches.
Figure 4C:
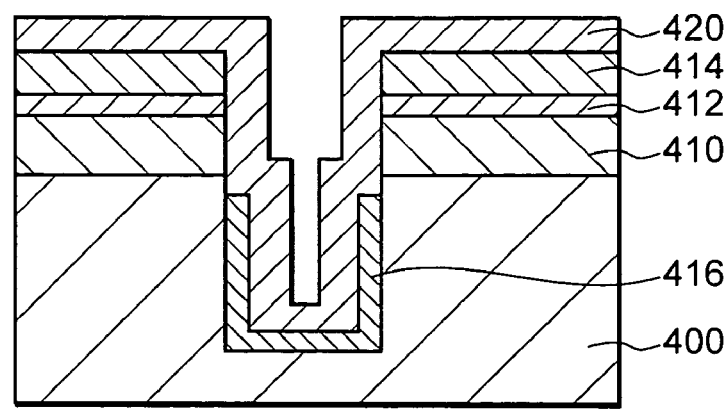
FIG. 4(c) is a view subsequent to the formation of a thermal oxide film by thermal oxidation of the polysilicon.

Next, a thermal oxide film 416 corresponding to a first thermal oxide film is formed about 500 Å on a silicon surface lying inside the exposed deep trench by thermal oxidation, and polysilicon 418 is formed over the whole surface of the silicon substrate 400 with a thickness of about 0.1 μm (see FIG. 4(b)). Further, the polysilicon 418 is fully thermally oxidized. A thermal oxide film 420 corresponding to a second thermal oxide film formed by thermal oxidation reaches a thickness of about 0.2 μm (see FIG. 4(c)).

Thus, the interior of the deep trench is buried substantially with the thermal oxide films 416 and 420. Since, however, a small gap less than or equal to 0.1 μm is defined in the thermal oxide film 420, the gap is buried with a TEOS film 422 corresponding to a CVD oxide film placed in a low pressure state, which is suitable for burying such a portion. Further, heat treatment is done at about 800° C. to dehydrate moisture in the film.

Thereafter, the oxide film is full-face etched back to remove the thermal oxide film 420 and the CVD oxide film 414 deposited over the surface of the silicon substrate 400.

At this time, the nitride film 412 is endpoint-detected (i.e., a change of the etching film from the CVD oxide film to the nitride film is detected), whereby etching is completed in a state in which the nitride film 412 has been exposed (see FIG. 5(a)). Further, the nitride film 412 left on the surface is removed by thermal phosphoric acid to thereby realize an isolation structure in which the interior of the deep trench is buried with the oxide film (see FIG. 5(b)).

According to the present embodiment, as distinct from the conventional method for burying the interior of the deep trench with only the TEOS film high in embeddability, the deep trench is buried with the thermal oxide film formed on the trench surface and the thermal oxide film formed by thermal oxidation of the thin film polysilicon formed on the thermal oxide film, and the TEOS film is formed in the gap alone. Therefore, it is possible to reduce stress developed with the shrinkage of the buried film. If heat treatment is further done to dehydrate the moisture in the film, then the stress with the shrinkage of the buried film almost disappears.

Thus, since the stress caused by the insulating film embedded in the deep trench is suppressed, the probability of occurrence of dislocation can be greatly reduced. By utilizing the present embodiment and the first through third embodiments in combination, a diode array or a transistor array less reduced in crystal defect can be formed in practice.

Although the preferred embodiments of the present invention have been described above with reference to the accompanying drawings, it is needless to say that the present invention is not limited to such embodiments. It will be apparent to those skilled in the art that various changes and modifications can be supposed to be made to the invention within the scope described in the claims. It should be understood that those changes and modifications fall within the technical scope of the present invention.

The present invention can be applied to a semiconductor device formed with a diode array or a transistor array and a method of manufacturing the semiconductor device. The present invention is applicable particularly to a diode array or a transistor array which reduces stress developed at an intersecting portion of deep trenches for device isolation to thereby lessen the occurrence of crystal defects, and a method of embedding the deep trenches.

What is claimed is:

1. A semiconductor device formed with a diode array together with bipolar transistors, comprising:
    at least one LOCOS oxide film which isolates one direction of the diode array; and
    deep trenches which isolate a direction normal to the one direction of the diode array,
    wherein the depth of each of the deep trenches is deeper than a high density layer embedded below a collector layer of the bipolar transistor.

2. A semiconductor device according to claim 1, further comprising trenches each deeper than the high density layer, each of which connects between the deep trenches in such a manner that a connecting portion of the deep trenches takes a T type.

3. A semiconductor device according to claim 2, wherein the trenches respectively connecting between the deep trenches in the T type are formed every adjacent two diodes, and an electrode electrically connected to the high density layer is formed between the two diodes.

* * * * *